United States Patent [19]

Miyazaki

[11] Patent Number: 5,337,006
[45] Date of Patent: Aug. 9, 1994

[54] OUTPUT LEVEL CONTROL CIRCUIT FOR USE IN RF TRANSMITTER

[75] Inventor: Shinichi Miyazaki, Tokyo, Japan

[73] Assignee: NEC Corporation, Tokyo, Japan

[21] Appl. No.: 915,545

[22] Filed: Jul. 20, 1992

[30] Foreign Application Priority Data

Jul. 19, 1991 [JP] Japan ................................ 3-179841

[51] Int. Cl.$^5$ ........................................... H03G 3/20
[52] U.S. Cl. .................... 330/130; 330/138; 330/279; 330/280; 455/116; 455/126
[58] Field of Search ................. 330/127–129, 330/130, 138, 279, 280; 455/116, 126, 127

[56] References Cited

U.S. PATENT DOCUMENTS 4,523,155 6/1985 Walczak et al. ................... 330/279
4,992,753 2/1991 Jensen et al. ....................... 330/129

FOREIGN PATENT DOCUMENTS 0434294 6/1991 European Pat. Off. .

OTHER PUBLICATIONS

EIA Interim Standard, IS-19-B, 3.1.3.3, Jan. 1988, U.S.A.

Primary Examiner—James B. Mullins
Attorney, Agent, or Firm—Sughrue, Mion, Zinn, Macpeak & Seas

[57] ABSTRACT

An output level control circuit for radio-frequency transmitter which intermittently transmits radio-frequency carrier waves such as seen in the TDMA radio communication system and the digital cellular mobile telephone system. The variable gain amplifier unit of this transmitter amplifies the transmitting signal to a predetermined output power level in response to a control signal, the output power level is detected by a detecting diode which receives the application of a temperature-compensated bias voltage, and the sum of the detected output and the bias voltage becomes the detection output to the control loop. The bias voltage of the detecting diode is stored by bias voltage detection circuit during the off-period of the transmitting signal, an input reference voltage that is supplied in synchronism with the turning-on of the transmitting signal and the stored bias voltage are added by reference signal addition circuit, and the added output is served as the reference voltage that corresponds to the predetermined output power level. A power control circuit generates the control signal in response to the added output and the detection output, and the control signal controls the output power level of the variable gain amplifier unit.

13 Claims, 3 Drawing Sheets

OUTPUT LEVEL CONTROL CIRCUIT FOR USE IN RF TRANSMITTER

BACKGROUND OF THE INVENTION

The present invention relates to an output level control circuit for a radio-frequency transmitter, and more particularly to an output level control circuit for a radio-frequency transmitter which intermittently transmits a radio-frequency signal such as a transmitter in a digital cellular mobile telephone system or the like.

An output level control circuit which maintains the transmit power of a radio-frequency transmitter at a predetermined output level comprises a radio-frequency signal detector (referred to as a signal detector hereinafter) which detects the peak level of a radio-frequency signal output from a variable gain amplifier unit. The control circuit also comprises a comparator unit which compares the output of the signal detector and a reference voltage corresponding to the predetermined output level, and a control unit which controls the output level of the variable gain amplifier unit in response to the output of the comparator unit.

In order to maintain the amplifier's output at a constant level over a wide range of temperature, the signal detector is required to be able to detect with high accuracy the radio-frequency power level over a wide range of temperature. A signal detector of this type is disclosed in U.S. Pat. No. 4,523,155 (issued on Jun. 11, 1985), which detector is aimed at satisfying the above-mentioned requirement. The disclosed signal detector includes a detecting diode which produces a detection output in response to the envelope of the radio-frequency signal, and a temperature compensating diode which has characteristics substantially the same as those of the detecting diode and is thermally connected to the detecting diode. In this signal detector, a forward bias voltage is supplied to the detecting diode via a bias voltage setting resistor from a bias voltage supply source. The detected signal is obtained as the superposition of the detected voltage and the bias voltage via a load resistor connected to the detecting diode. The forward bias voltage is also supplied to the temperature compensating diode from the bias voltage supply source, wherein the voltage of the bias voltage supply source is changed accompanying the variations in the forward voltage of the temperature compensating diode. Since the bias voltage of the detecting diode is the result of subtracting the forward voltage of the detecting diode from the voltage of the bias voltage supply source, it will be canceled by the temperature variations of the forward voltage of the temperature compensating diode even if it contains temperature variations. Accordingly, this signal detector is capable of producing a detected signal which is not affected by the changes in the temperature.

The comparator unit compares the reference voltage that corresponds to a predetermined output level of an intermittent transmitting signal with the voltage of the detected signal, and the comparison output is supplied to the control unit. The control unit controls the gain of the variable gain amplifier unit so as to bring the detected signal to conform with the reference voltage. When the reference voltage is raised or lowered, the detected signal, which corresponds to the output level of the transmitting signal, has to quickly follow the raised or lowered reference voltage. For example, in accordance with the recommended standard (EIA Interim Standard, IS-19-B, 3.1.3.3, January 1988, U.S.A.) for the 800 MHz cellular subscriber units of the EIA system, it is prescribed that the rise and the fall times of the transmitting signal be less than 2 milliseconds.

Since, however, the above-mentioned output level control circuit carries out the control of the output level, at the time of the rise of the transmitting signal, only when the reference voltage is higher than the signal detector output, it is not possible to perform the control of the output level until the reference voltage becomes higher than the bias voltage of the detecting diode when a bias voltage is applied to the detecting diode for the purpose of temperature compensation as mentioned above. Consequently, at the time of starting transmitting radio power, the output voltage from the detecting diode does not change until the reference voltage exceeds the bias voltage, resulting in a problem that the rise of the radio transmitting power is delayed by that period, being unable to satisfy the above-mentioned standard rise time.

A remedy is available to hasten the rise of the transmitting power by giving an extremely high value to the control loop gain of the output level control circuit. However, the adoption of this remedy not only makes the circuit tend to generate the overshoot of the transmitting power or the oscillation of the control loop, but also requires the addition of parts for amplification and filtering to the control loop.

SUMMARY OF THE INVENTION

An object of the present invention is therefore to provide an output level control circuit for a radio-frequency transmitter whose output level can stably be maintained over a wide range of temperature.

Another object of the present invention is to provide an output level control circuit for a radio-frequency transmitter which transmits intermittently radio-frequency signals at one selected level among a plurality of predetermined output levels in accordance with a reference voltage and whose output level is free from delay in the rise of the reference voltage.

A further object of the present invention is to provide an output level control circuit of the aforementioned kind in which the number of components that constitute the control loop circuit can be reduced as much as possible.

The output level control circuit of a radio-frequency transmitter according to this invention comprises a signal detector which includes a detecting diode which receives the application of a bias voltage that is substantially the same as in the above-mentioned circuit in the prior art and a temperature compensating diode, and detects the crest valve of a radio-frequency output from a variable gain amplifier unit, a comparator unit which compares the signal detector output corresponding to the detection output of the signal detector and the reference voltage corresponding to the predetermined output level, and control means which controls the output level of the variable gain amplifier unit in response to an output of the comparator unit. This output level control circuit further includes bias voltage detecting means which detects the bias voltage of the detecting diode and stores the detected result, and reference voltage control means which adds the stored bias voltage and an input reference voltage to designate the result as the reference voltage.

The reference voltage is the sum of the input reference voltage and the bias voltage of the detecting diode, which is a voltage invariably higher than the output voltage (signal detector output) of the detecting diode during the rise of the input reference voltage. Accordingly, the power supply control unit which receives the result of comparison of the reference voltage and the signal detector output is capable of giving an effective gain controlling signal to the variable gain amplifier unit even in the initial period of application of the input reference voltage, and the rise of the transmitting output and the signal detector output will never be left behind the change of the input reference voltage. Furthermore, the output of the comparator unit can follow the input reference voltage also at the time of fall of the input reference voltage similar to the case of rising voltage.

BRIEF DESCRIPTION OF THE DRAWINGS

The above-mentioned and other objects, features and advantages of the present invention will become more apparent from the following detailed description when taken in conjunction with the accompanying drawings, wherein:

FIG. 2(a,b,c) is a waveform diagram showing waveforms appearing at various points of the transmitter in FIG. 1, wherein FIG. 2(a) shows the waveform of the transmit output signal Po, FIG. 2(b) shows the waveform of the output voltage A of the detecting diode and FIG. 2(c) shows the waveforms of the reference voltages E and G;

DETAILED DESCRIPTION OF THE PREFERRED EMBODIMENT

Figure 1:
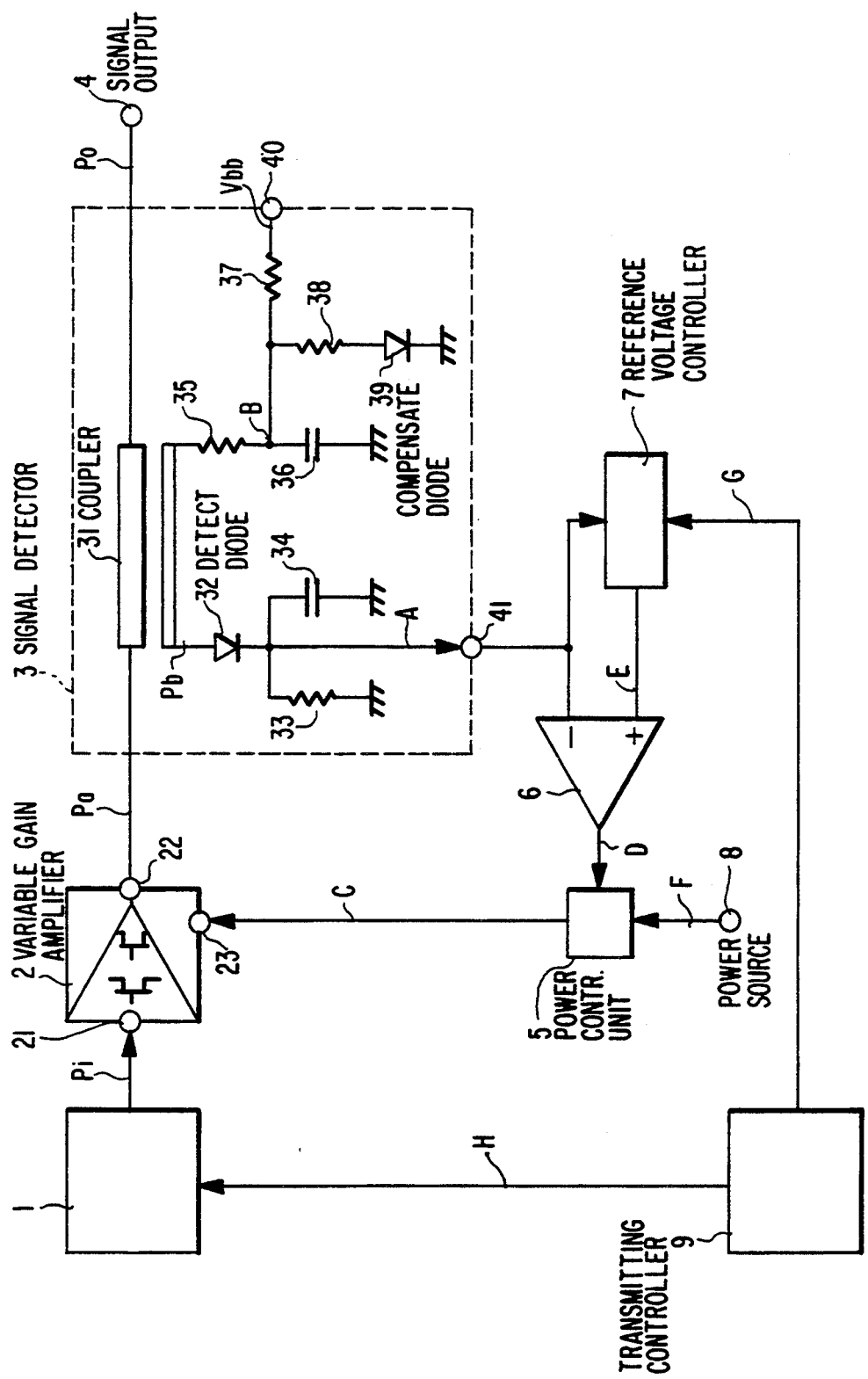
FIG. 1 is a block diagram showing part of radio-frequency transmitter embodying the present invention.

Referring to FIG. 1, a radio-frequency transmitter 100 intermittently outputs a transmitting output signal Po of radio frequency. The transmitter 100 includes a transmitting signal generator 1 which generates a burst input signal Pi under the control of a transmitting controller 9. The transmitter 100 also includes a variable gain amplifier unit 2 which generates an amplified signal Pa by amplifying the input signal Pi, and a signal detector 3 which generates the transmitting output signal Po by leading the most part of the amplified signal Pa to a signal output terminal 4. The supply timing of the input signal Pi is controlled by a transmission control signal H from a transmission control unit 9. The signal detector 3 also supplies a part Pb of the amplified signal Pa to a detecting diode 32 via a coupler 31, and the detecting diode 32 generates across a load resistor 33 a signal detector output A which corresponds to the peak level of the coupler output signal Pb, that is, the peak level of the transmitting output signal Po. The signal detector 3 further includes a compensating diode 39 with substantially the same temperature characteristic as that of the detecting diode 32. The detecting diode 32 and the compensating diode 39 receive application of substantially the same value of bias voltage, and are connected so as to subtract the bias voltage variation in the compensating diode 39 from the bias voltage variation in the detecting diode 32 generated accompanying the temperature variation in the forward voltage. Accordingly, the signal detector output A that appears across the load resistor 33 includes also a fixed bias voltage A0 with compensated temperature variations along with a detected output corresponding to the transmitting output signal Po.

The signal detector output A from the signal detector 3 is supplied to the inverting terminal of an operational amplifier 6, and it is compared with a reference signal E supplied to the non-inverting terminal of the operational amplifier 6. A comparison output voltage D from the operational amplifier 6 is supplied to a power control unit 5. The power control unit 5 generates a control signal C from a source power voltage F of a source power input terminal 8 in response to the comparison output voltage D, namely, a voltage obtained by reducing the source power voltage F in response to the magnitude of the comparison output voltage D, and supplies the control signal C to a control signal input terminal 23 of the variable gain amplifier unit 2. In response to the control signal C, the variable gain amplifier unit 2 controls the source power voltage of the amplifier element, the drain voltage of a field effect transistor (FET) here, and causes the amplification gain to be changed so as to generate a predetermined transmitting output signal Po at the signal output terminal 4 corresponding to the reference voltage E.

The transmitting signal generator 1, the variable gain amplifier unit 2, the signal detector 3, the power control unit 5, the operational amplifier 6, and the transmitting controller 9 have the same functions as in the output level control circuit of the conventional radio-frequency transmitter. On the other hand, the output level control circuit according to this invention further includes, besides the above-mentioned various components, a reference voltage controller 7 having a bias voltage detecting circuit which stores the temperature-compensated bias voltage A0 generated across the load resistor 33 during the non-input period of the input signal Pi and a reference voltage adding circuit which superimposes the stored bias voltage A0 on the input reference voltage G. The reference voltage G is supplied from the transmitting controller 9 in synchronism with the transmitting control signal H, and hence in synchronism with the input signal Pi.

Figure 2:
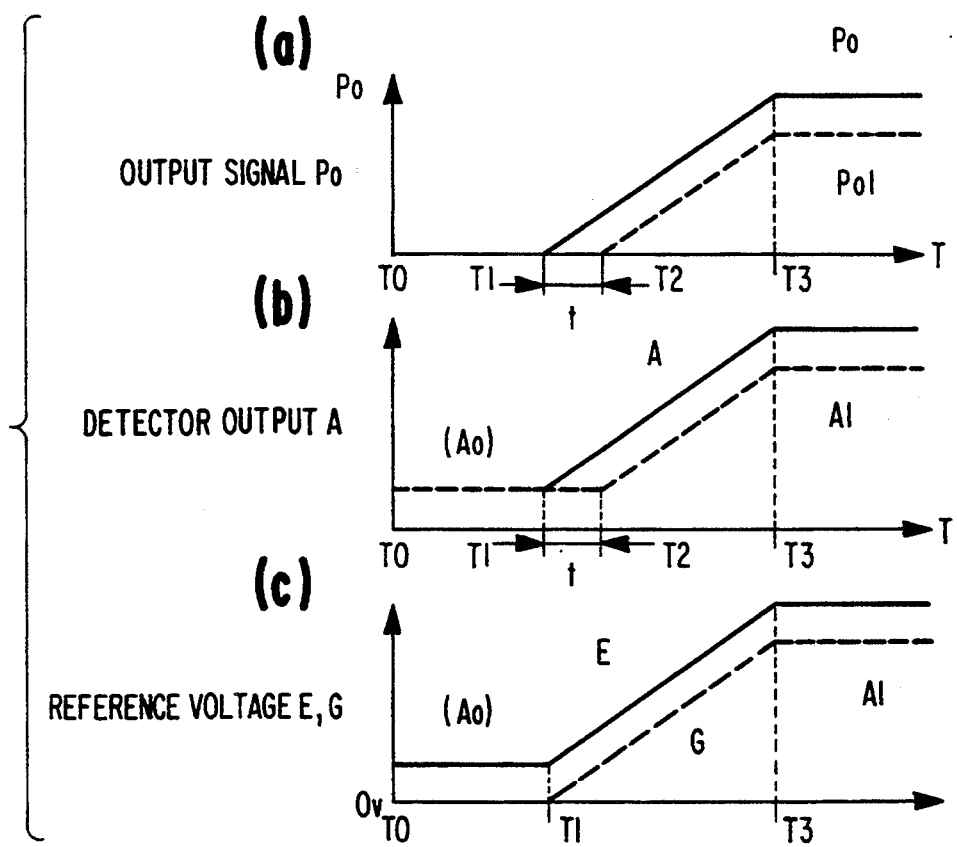

Referring simultaneously to FIG. 1 and FIG. 2, the radio-frequency transmitter 100 is in the off-period of the transmitting output signal Po for the duration from the time T0 to the time T1, and the reference voltage G synchronized with the input signal Pi will not be supplied either. During this period the detecting diode 32 does not detect a coupler output signal Pb so that the output voltage A of the diode 32 is substantially equal to the fixed bias voltage A0. The fixed bias voltage A0 during the off-period of the transmitting output signal Po is stored in the bias voltage detecting circuit of the reference voltage controller 7, and the stored bias voltage A0 is supplied to the reference voltage adding circuit of the controller 7. Since here the on/off period of the input signal Pi coincides with the on/off period of the reference voltage G, the reference voltage controller 7 determines the input time of the bias voltage A0 to be stored by referring to the reference voltage G. At the time T1, the input signal Pi and the reference voltage G are supplied from the transmitting signal generator 1 to the variable gain amplifier unit 2 and from the transmitting controller 9 to the reference voltage controller 7, respectively. Since the transmitting output signal Po is required to rise to a specified voltage within 2 milliseconds, the reference voltage G is raised according to a waveform in which the duration from the time T1 to the time T3 is set to be less than 2 milliseconds. The reference voltage controller 7 adds up the stored bias voltage A0 and the reference voltage G to obtain the reference voltage E for this output level control circuit. The reference voltage E is supplied to the inverting terminal of the operational amplifier. During the period from the time T1 to the time T3 the voltage A of the signal detector output is lower than the reference voltage E, and the gain control of the variable gain amplifier unit 2 by the power control unit 5 is put in effect. As a result, the power level of the transmitting output signal Po and the signal detector output A of the detecting diode 32 quickly follow the change in the reference voltage E, and at the time T3 the transmitting output signal Po reaches a predetermined output corresponding to the reference voltage G.

Moreover, if the input reference voltage G is supplied directly to the operational amplifier 6 as in the prior art (see FIG. 2(c)) instead of carrying out the above-mentioned reference voltage processing using the bias voltage detecting circuit and the reference voltage adding circuit of the reference voltage controller 7, the output voltage A1 of the detecting diode 32 (see FIG. 2(b)) rises delayed by a time t from the reference voltage G, and correspondingly the rise of a transmitting output signal Po1 is also delayed by the time t (see FIG. 2(a)). In the conventional transmitting level control circuit, this time interval t is as large as about 1 milliseconds, and it is difficult to reduce the rise time of the transmitting output signal Po1 smaller than the specified rise time (2 milliseconds). Since, however, it is possible in this embodiment to make the delay time t of the rise zero, it is easy to reduce the rise time (T3−T1) to within 2 milliseconds.

Furthermore, referring to FIG. 1, the power level of maximum output of the transmitting output signal Po of this radio-frequency transmitter is 0.6 W, and it is possible to carry out signal transmission by arbitrarily selecting one of a plurality of output power levels that are separated by an equal difference of 4 dB.

The variable gain amplifier unit 2 is an amplifier including an FET as the amplifier element, which amplifies the input signal Pi from a signal input terminal 21, and outputs an amplified signal Pa from a signal output terminal 22. The control signal C from the power control unit 5 is input to a control signal input terminal 23 of the variable gain amplifier unit 2, controls the drain voltage of the FET, and controls the gain of the variable gain amplifier unit 2 by this drain voltage control.

Still referring to FIG. 1, the signal detector 3 connects the coupling end of a signal coupler 31 to the anode of the detecting diode 32, connects the cathode of the diode 32 to a detecting voltage output terminal 41, and outputs the signal detector output A through the detecting voltage output terminal 41. The load resistor 33 and a capacitor 34 which forms a bypass circuit of the radio-frequency signal are connected in parallel between the cathode of the diode 32 and a grounding potential point. In addition, the insulated terminal of the signal coupler 31 is connected to a series circuit of a terminal resistor 35 and a bypass capacitor 36 of the radio-frequency signal, the series circuit terminating the amplified signal Pa. A bias voltage Vbb is supplied from a bias voltage input terminal 40, and the bias voltage Vbb gives a forward bias voltage to the anode of the compensating diode 39 that has its cathode grounded, via a series circuit of resistors 37 and 38. The junction of the resistors 37 and 38 is commonly connected to the junction (point B) of the resistor 35 and capacitor 36, and the bias voltage A0 which is substantially equal to the bias voltage of the compensating diode 39 is given also to the detecting diode 32. It should be noted that the voltage of the bias voltage supply point B is determined principally by the compensating diode 39 and the circuit on the resistor 38 side.

When the amplified signal Pa is not input, the load voltage that is produced at the detecting voltage output terminal 41 or across the resistor 33, that is, the bias voltage A0 of the diode 32, is lower than the voltage at the common junction B (referred to as $V_B$) by the amount of the forward voltage Vf of the diode 32. Since the forward voltage Vf of the diodes 32 and 39 changes accompanying temperature variations the voltage at the point B which supplies the bias voltage to the diodes 32 and 39 changes by the same amount of voltage in response to the variations in the forward voltage Vf. Accordingly, the temperature variations in the forward voltage Vf due to the diodes 32 and 39 cancel with each other so that the voltage A0 generated at the detecting voltage output terminal 41 essentially does not change. Next, when the amplified signal Pa is applied to the signal detector 3, the detecting diode 32 detects the coupler output signal Pb, and generates the signal detector output A which is the sum of the bias voltage A0 and the detection output across the load resistor 33, that is, at the detecting voltage output terminal 41.

Figure 3:
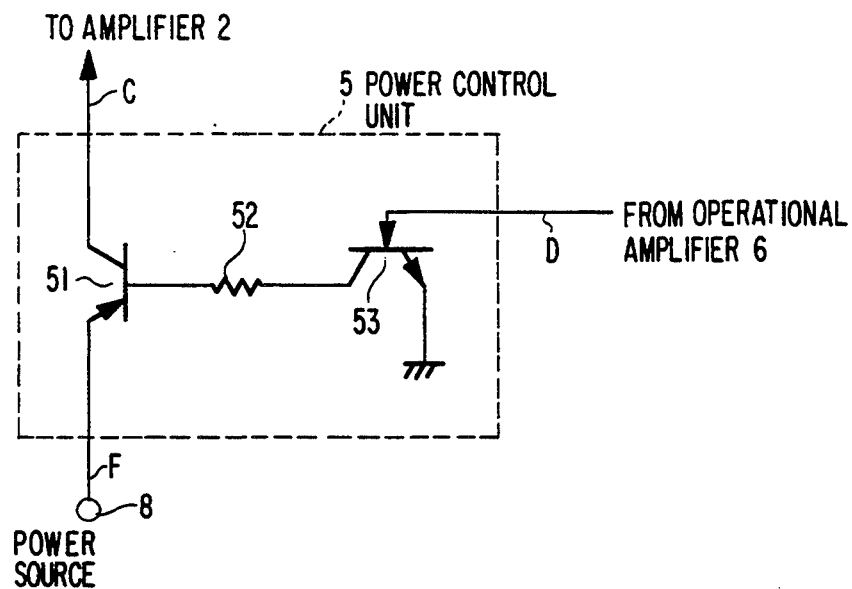
FIG. 3 is a circuit diagram showing a power control unit 5 in the FIG. 1 transmitter.

Referring to FIG. 3, the power control unit 5 has a transistor 51 to whose emitter a source power voltage F from a source power input terminal 8 is applied. The transistor 51 generates at its collector a control signal C obtained by lowering the source power voltage F in response to its base current. In addition, a comparison output voltage D from the operational amplifier 6 is supplied to the base of a transistor 53, and the transistor 53 generates a collector current which corresponds to the comparison output voltage D. The collector current of the transistor 53 is supplied to the base of the transistor 51 via a resistor 52 to be served as the base current of transistor 51. Since the voltage drop due to the transistor 51 is decreased as the base current of the transistor 51 is increased, the voltage of the control signal C supplied to the drain terminal of the FET built in the variable gain amplifier 2 is raised, increasing the gain of the variable gain amplifier 2. Accordingly, if the voltage of the signal detector output A is lower than the reference voltage E, the comparison output voltage D from the operational amplifier 6 is raised, and the raise in the comparison output voltage D elevates the gain of the variable gain amplifier unit 2. The increase in the gain of the variable gain amplifier unit 2 causes voltage of the signal detector output A to be raised until it agrees with the reference voltage E.

Figure 4:
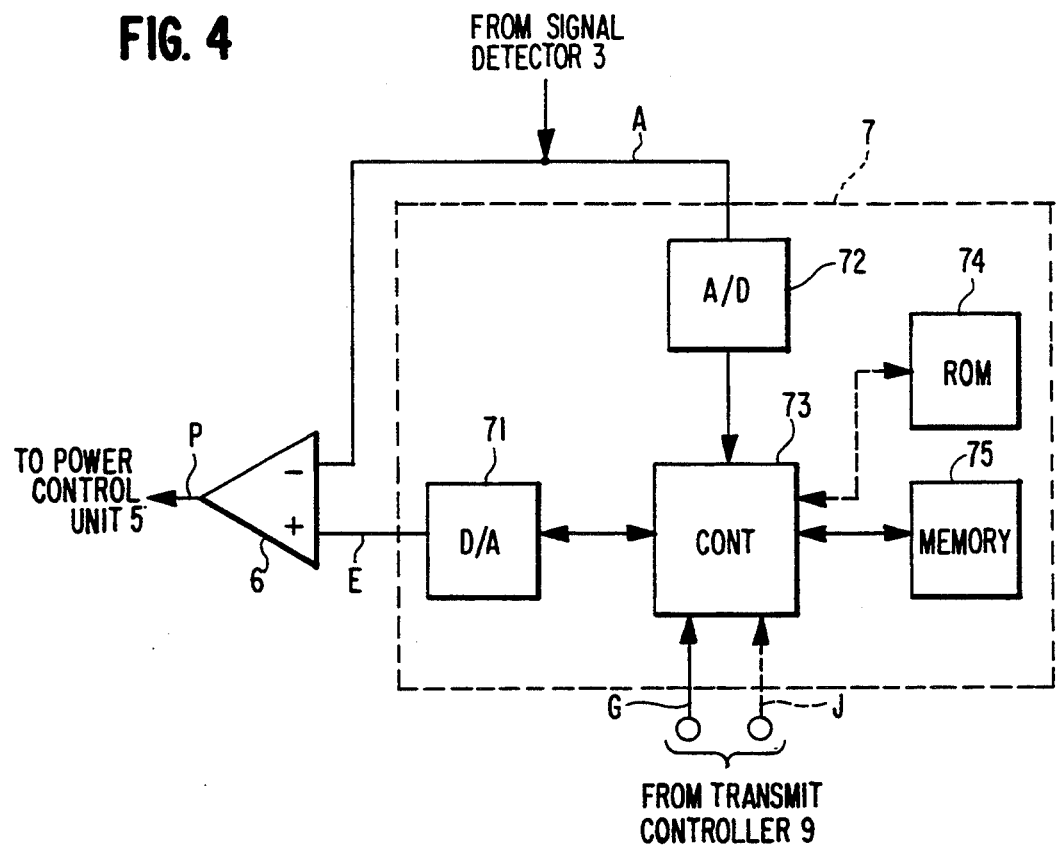
FIG. 4 is a block diagram showing an operational amplifier 6 and a reference voltage controller 7 in the FIG. 1 transmitter.

Referring to FIG. 4, the reference voltage controller 7 carries out digital signal processing in response to the analog signal detector output A from the signal detector 3 and the digital reference voltage G from the transmitting controller 9, and the reference voltage E which is signal processed is supplied to the non-inverting terminal of the operational amplifier 6. The signal detector output A is converted to a digital signal by an analog to digital (A/D) converter 72, and the obtained digital signal is input to a controller (CONT) 73. This digital signal is sampled by the controller 73 for every off period of the reference voltage G. The sampled digital signal is stored in a memory 75, and updated. The digital signal stored in the memory 75 corresponds to the bias voltage A0 of the diode 32. On the other hand, the reference voltage G is directly input to the controller 73. When the reference voltage G is inputted, the controller 73 adds the reference voltage G and the digital signal stored in the memory 75, and supplies the added output to a digital to analog (D/A) converter 71. The D/A converter 71 converts the added output to the analog reference voltage E, and supplies the reference voltage E to the non-inverting terminal of the operational amplifier 6.

It should be mentioned that when a high accuracy setting of the bias voltage A0 is not required, it is unnecessary to update the digital signal for every off period of the input of the reference voltage G, and may be substituted by a preliminary storage in a read-only memory 74 of the bias voltage A0 obtained by an experiment or the like.

Furthermore, the aforementioned operation may be replaced by the input of a transmission timing signal J from the transmitting controller 9 to the controller 73 synchronized with the input signal Pi, by storing in advance the reference voltage G and the bias voltage A0 in the memory 74. The controller 73 reads the reference voltage G and the bias voltage A0 from the memory 74 synchronized with the timing signal J to add these two voltages, and supplies the added signal to the D/A converter 71.

As described in the above, the output level control circuit of the radio-frequency transmitter according to this invention can stably maintain the output power level of the transmitting output signal Po over a wide range of temperature by newly forming the reference voltage E through addition of the bias voltage A0 of the detecting diode 32 and the input reference voltage G, and controls the output power level so as not to be left behind the rise of the input reference voltage G. Moreover, the above-mentioned output level control circuit does not require the construction of a special control loop so that the reduction of the number of circuit components can also be accomplished.

Although the invention has been described with reference to a specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. An output level control circuit for use in a radio-frequency transmitter, comprising:
   variable gain amplifier means for amplifying an intermittently supplied radio-frequency input signal with a gain corresponding to a control signal to produce an amplified signal;
   detector means having a detecting diode biased by a bias voltage, said detector means detecting the power level of said amplified signal and producing a detector output which is the sum of the detected power level and said bias voltage;
   control signal generating means responsive to a difference between said detector output and a reference voltage for generating said control signal; and
   reference voltage control means for generating said reference voltage by adding said bias voltage to an input reference voltage supplied in synchronism with the turning-on of said transmitting signal.

2. An output level control circuit as claimed in claim 1, wherein said detector means comprises signal coupler means for supplying a part of said amplified signal to said detecting diode and bias means for keeping said bias voltage of said detecting diode substantially constant irrespective of the temperature variations.

3. An output level control circuit as claimed in claim 2, wherein said bias means comprises first, second and third resistors and a compensating diode having an anode connected to a bias voltage supply point via said first resistor and a cathode grounded, and wherein the anode of said detecting diode is connected to said bias voltage supply point via said second resistor and said signal coupler and wherein the cathode of said detecting diode is connected to said third resistor, said detector output from said detector means being outputted with respect to said third resistor.

4. An output level control circuit as claimed in claim 2, wherein said control signal generating means comprises comparator means for comparing said reference voltage and said detector output, and power control means for generating said control signal in response to the output delivered from said comparator means.

5. An output level control circuit as claimed in claim 4, wherein said power control means comprises a first transistor receiving the output of said comparator means at its base and having an emitter grounded; and a second transistor having a base connected to the collector of said first transistor via a resistor and a collector served as the output terminal of said control signal, said emitter of the second transistor being served as the input terminal of a power supply.

6. An output level control circuit as claimed in claim 5, wherein said variable gain amplifier means comprises a field effect transistor as an amplifier element for said transmitting signal and wherein said control signal controls the drain voltage of said field effect transistor.

7. An output level control circuit as claimed in claim 1, wherein said reference voltage control means comprises storing means for storing the bias voltage of said detecting diode during the off-period of said transmitting signal and adding means for adding said stored bias voltage and said input reference voltage to produce said reference voltage.

8. An output level control circuit as claimed in claim 1, wherein said reference voltage control means comprises:
   analog to digital conversion means for converting said detector output delivered from said detector means into a digital signal;
   memory means for storing said digital signal of the off-period of said transmitting signal;
   controller means connected to said memory means for generating an added output by adding said digital signal stored in said memory means and said input reference voltage; and
   digital to analog conversion means for converting said added output to an analog signal to produce said reference voltage.

9. An output level control circuit as claimed in claim 1, wherein said reference voltage control means comprises:
   memory means for storing data corresponding to said bias voltage of said detecting diode;

controller means for generating an added output by adding said data stored in said memory means and said input reference voltage; and digital to analog conversion means for converting said added output into an analog signal corresponding to said reference voltage.

10. An output level control circuit as claimed in claim 1, wherein said reference voltage control means comprises:

memory means for storing the bias voltage set in advance and said input reference voltage;

controller means for generating an added output by adding said stored bias voltage and said stored input reference voltage synchronized with the on-state of said transmitting signal; and digital to analog conversion means for converting said added output to an analog signal and producing an analog signal as said reference voltage.

11. An output level control circuit for a radio-frequency transmitter, comprising:

variable gain amplifier means for amplifying an intermittently supplied radio-frequency transmitting signal in response to a control signal to produce an amplified signal;

signal detection means including a signal coupler which branches off a part of said amplifier signal, a detecting diode coupled to said signal coupler for detecting a signal level of said amplified signal, bias means which keeps a bias voltage of said detecting diode at a substantially constant level irrespective of temperature variations, and means for adding said signal level and said bias voltage to produce an added output voltage;

comparator means for comparing said added output voltage with a reference voltage;

power control means for generating said control signal in response to the output of said comparator means; and reference voltage control means for generating said reference voltage by adding the bias voltage of said detecting diode and an input reference voltage that is supplied in synchronism with the on-state of said transmitting signal.

12. An output level control circuit as claimed in claim 11, wherein said reference voltage control means includes first memory means for storing bias data corresponding to said bias voltage of said detecting diode, and adding means for adding said bias data and an input reference data corresponding to said input reference voltage to produce said reference voltage.

13. An output level control circuit as claimed in claim 11, wherein said reference voltage control means includes analog-to-digital conversion means for converting said added output voltage into a first digital signal, memory means for storing said first digital signal at a timing of an off-period of said amplified signal, the stored digital signal corresponding to the bias voltage of said detecting diode, adding means for adding said stored digital signal and a second digital signal representative of said input reference voltage, and digital-to-analog conversion means for converting said added output from said adding means into an analog signal of said reference voltage.

* * * * *